(12) United States Patent
Kim et al.

(10) Patent No.: US 9,842,680 B2
(45) Date of Patent: Dec. 12, 2017

(54) PRINTED CIRCUIT BOARD

(71) Applicant: Samsung Electro-Mechanics Co., Ltd., Suwon (KR)

(72) Inventors: Yu Sin Kim, Yeongi (KR); Sung Geun Kim, Yeongi (KR); Jong Jin Lee, Yeongi (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 37 days.

(21) Appl. No.: 14/221,909

(22) Filed: Mar. 21, 2014

(65) Prior Publication Data

US 2015/0145628 A1 May 28, 2015

(30) Foreign Application Priority Data

Nov. 25, 2013 (KR) .................. 10-2013-0143867

(51) Int. Cl.
| | |
|---|---|
| H01F 5/00 | (2006.01) |
| H01F 27/28 | (2006.01) |
| H05K 1/16 | (2006.01) |
| H01F 21/12 | (2006.01) |
| H05K 1/02 | (2006.01) |

(52) U.S. Cl.
CPC ........... H01F 27/2804 (2013.01); H01F 5/00 (2013.01); H01F 21/12 (2013.01); H05K 1/165 (2013.01); *H01F 2021/125* (2013.01); *H01F 2027/2809* (2013.01); *H05K 1/0298* (2013.01); *H05K 2201/09672* (2013.01); *H05K 2201/10053* (2013.01)

(58) Field of Classification Search
CPC .................. H01F 5/00; H01F 27/00–27/30

USPC ............. 336/65, 83, 200, 232; 361/760–766
See application file for complete search history.

(56) References Cited

U.S. PATENT DOCUMENTS

| | | | |
|---|---|---|---|
| 2007/0296548 A1* | 12/2007 | Hall ...................... | H03J 1/0008 340/10.1 |
| 2008/0031016 A1* | 2/2008 | Lin ......................... | H02M 1/34 363/21.03 |
| 2009/0321921 A1* | 12/2009 | Hwang ................... | H01L 23/13 257/701 |
| 2010/0320986 A1* | 12/2010 | Collins ................. | H02M 3/156 323/284 |
| 2012/0223411 A1* | 9/2012 | Cho ..................... | H01L 23/5227 257/531 |
| 2014/0029312 A1* | 1/2014 | Telefus ............. | H02M 3/33523 363/21.02 |

FOREIGN PATENT DOCUMENTS

KR  10-2011-0115122  10/2011

* cited by examiner

*Primary Examiner* — Tuyen Nguyen
(74) *Attorney, Agent, or Firm* — NSIP Law

(57) ABSTRACT

A printed circuit board, and more particularly, a printed circuit board that provides a variable inductance. A printed circuit board includes: an inductor positioned between an input terminal and an output terminal; a switch connected to the inductor; and a controller connected to the output terminal and the switch and outputting a control signal for controlling the switch to the switch, wherein the inductor is formed of a plurality of circuit patterns having different plating thicknesses and signal paths for the plurality of circuit patterns are selectively connected by operation of the switch according to the control signal.

9 Claims, 8 Drawing Sheets

[FIG. 1]
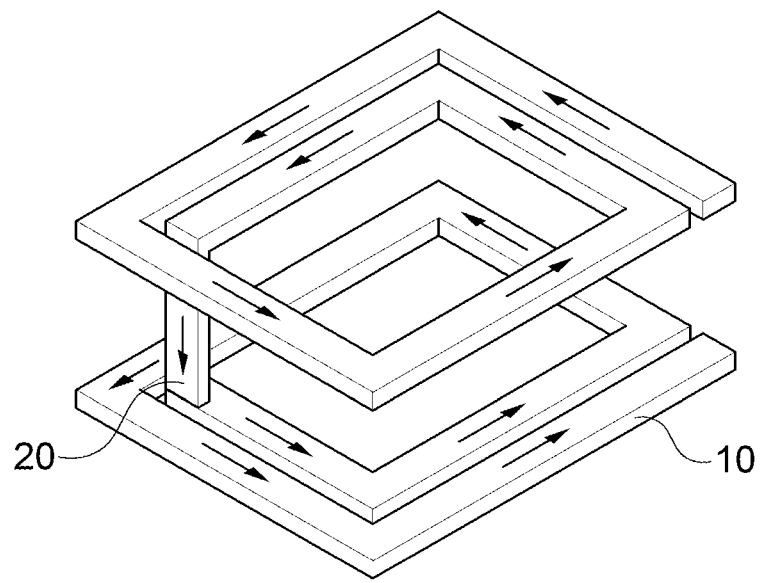
- PRIOR ART -

[FIG. 2]
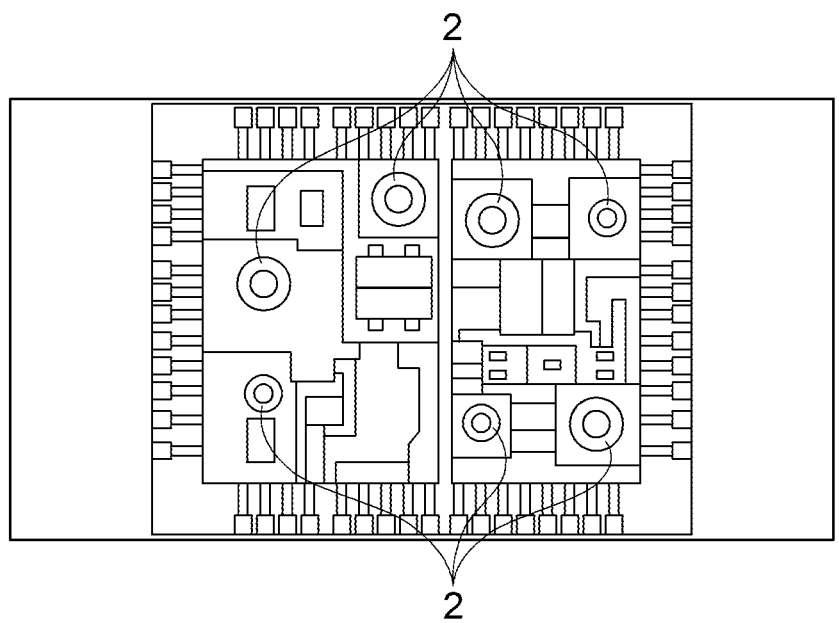
- PRIOR ART -

[FIG. 3]
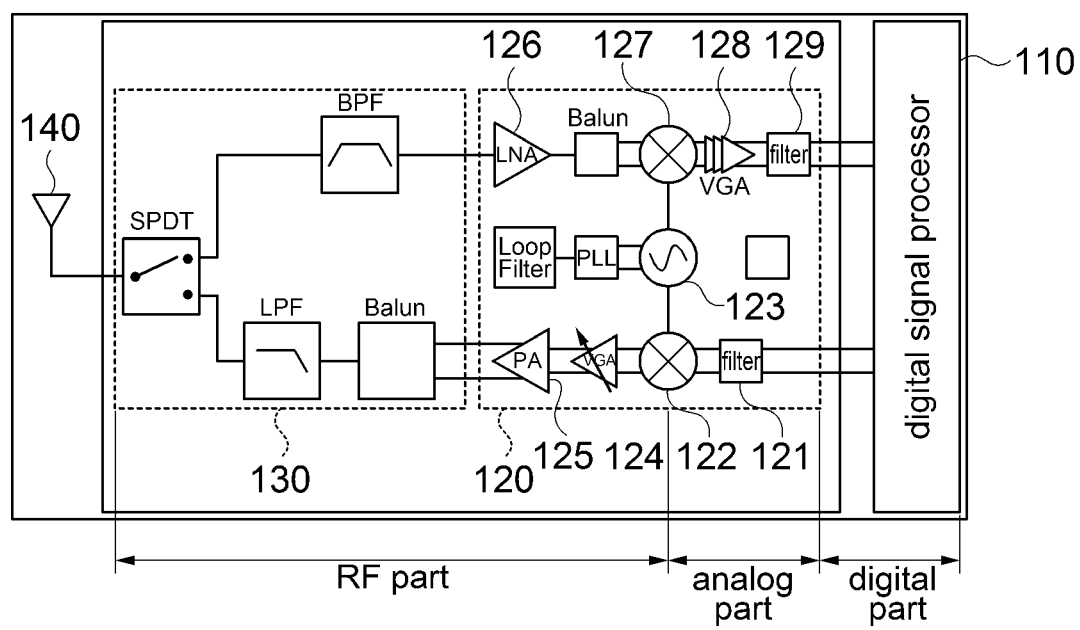
[FIG. 4]
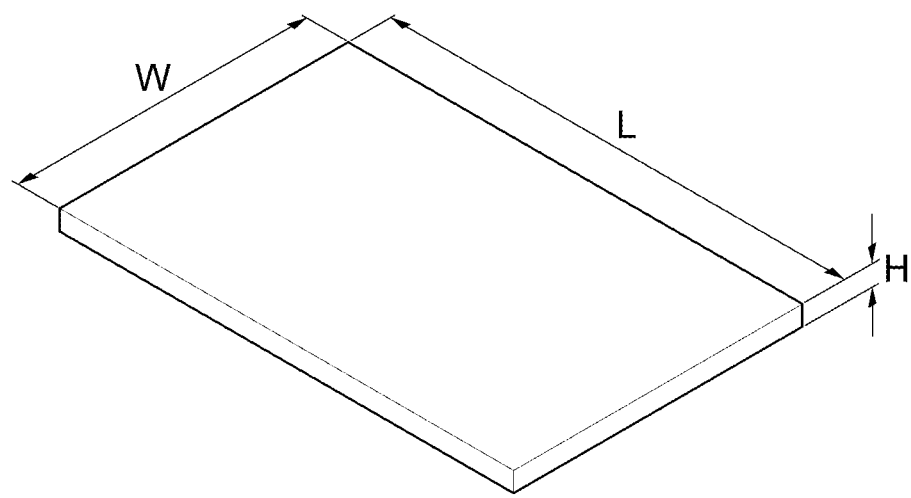

[FIG. 5]
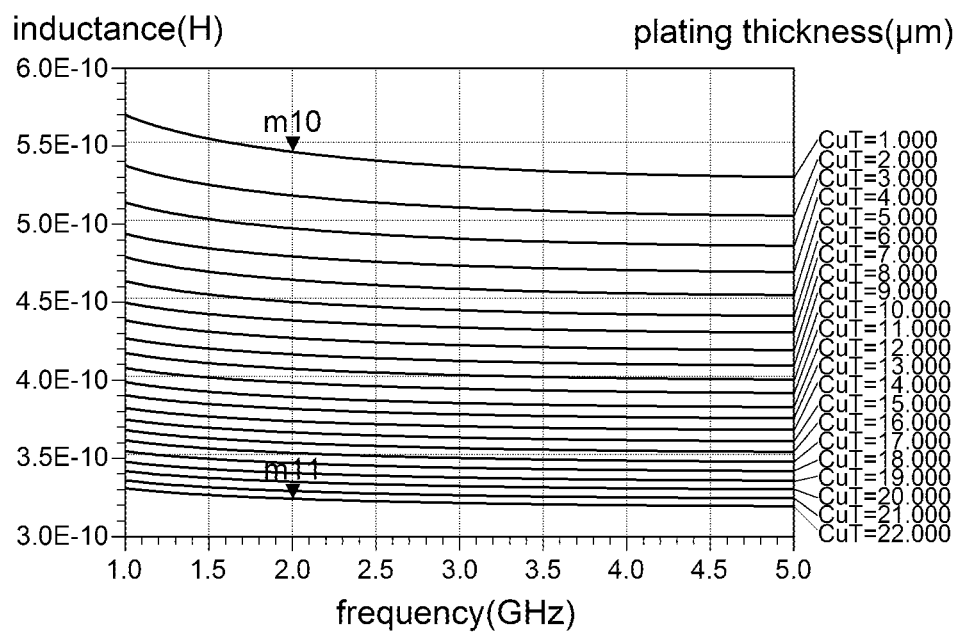
[FIG. 6]
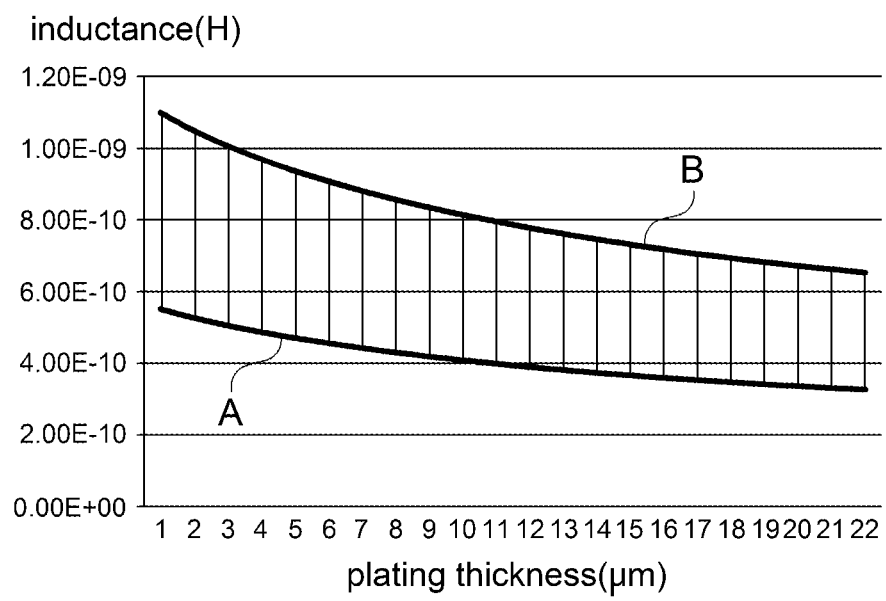

[FIG. 7]
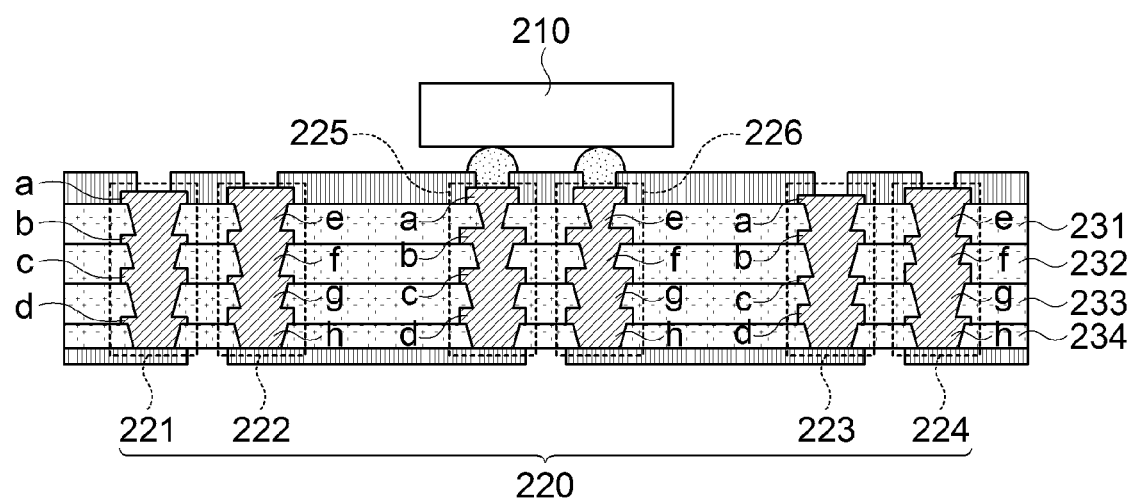
[FIG. 8]
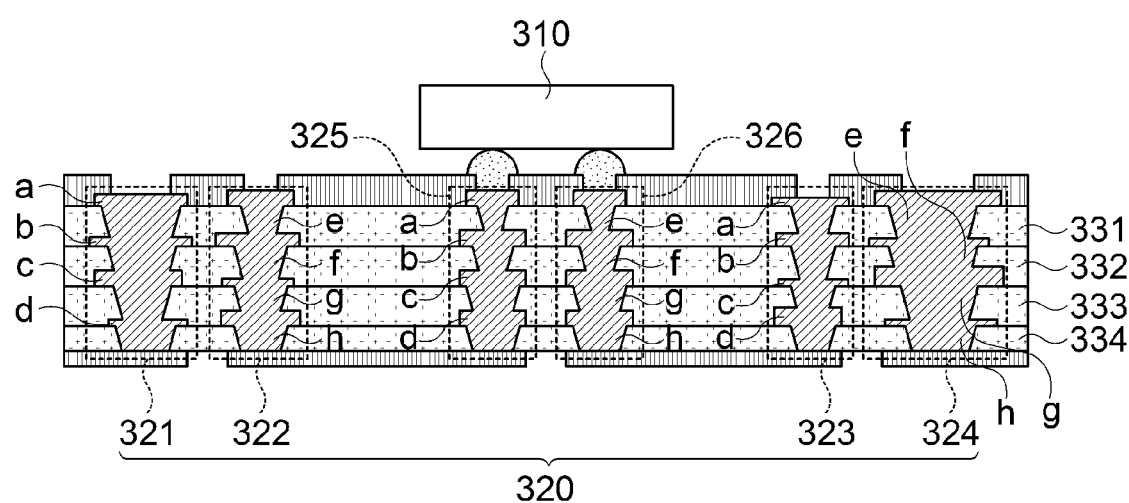

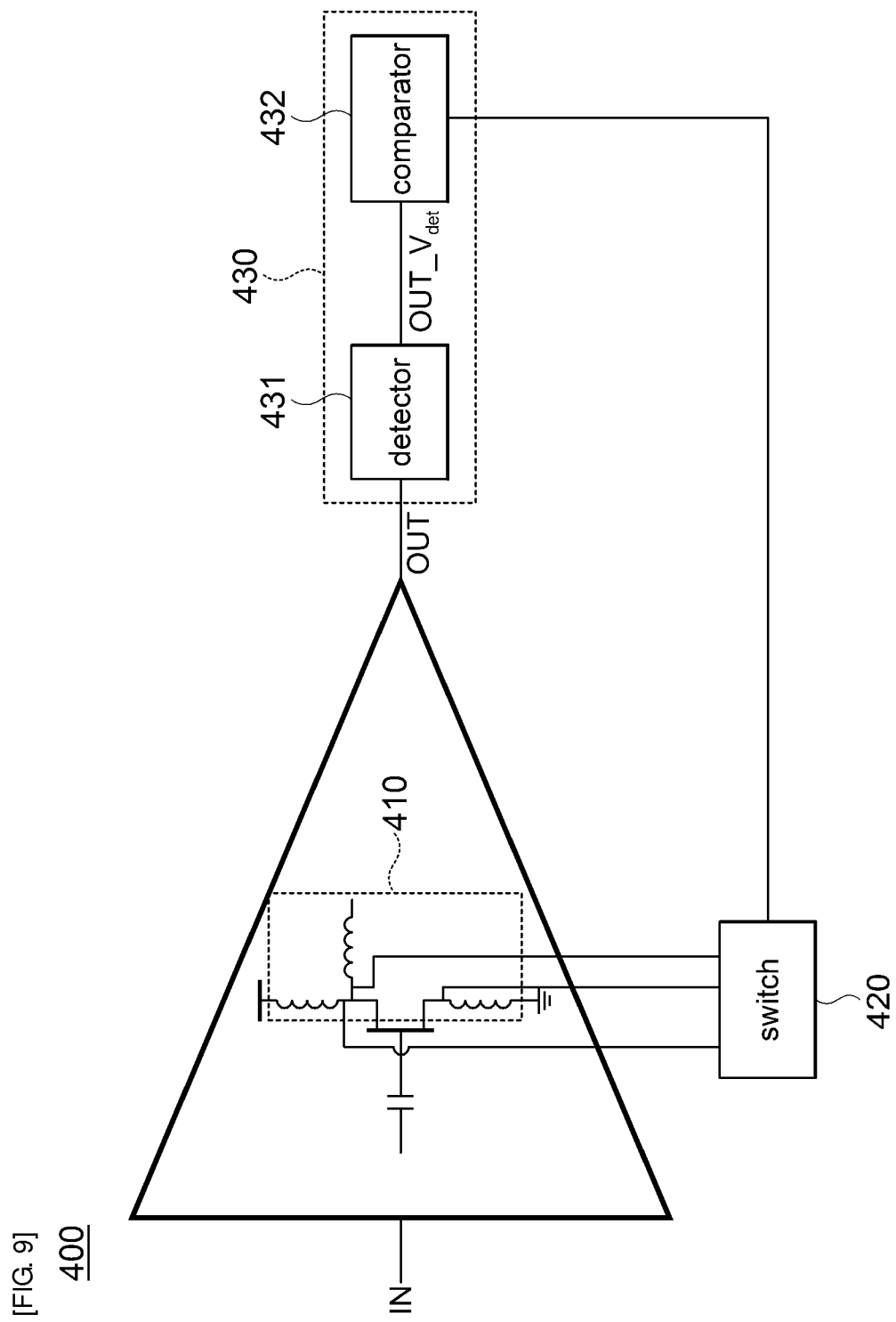

[FIG. 10A]
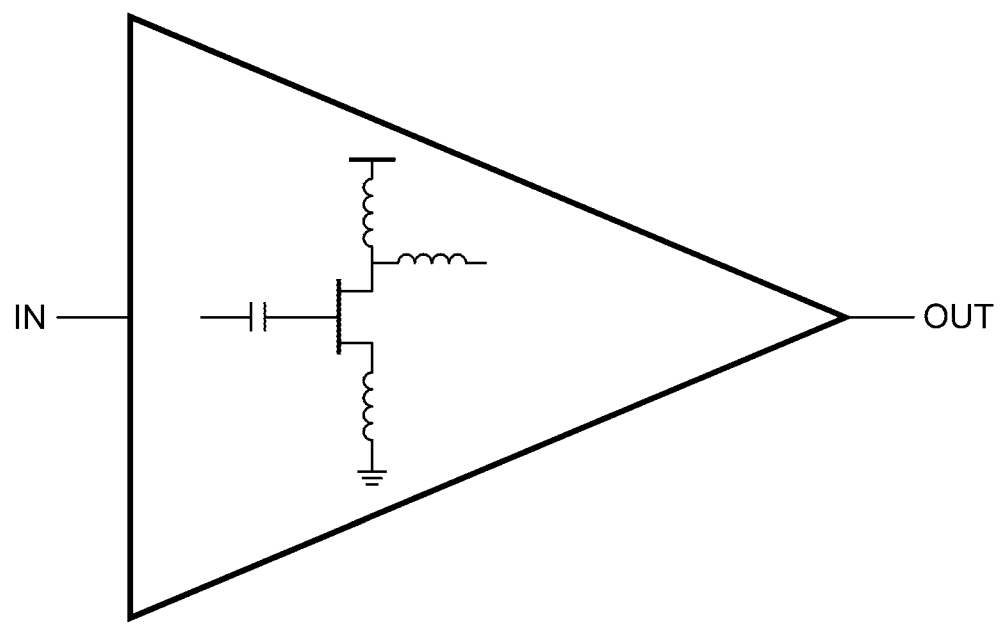
[FIG. 10B]
| L[nH] | OUT_V[mV] | OUT_PWR[dBm] |
|---|---|---|
| 3 | 67.5 | -13.3 |
| 3.1 | 69 | -13.2 |
| 3.2 | 69.5 | -13.1 |
| 3.3 | 70 | -13 |
| 3.4 | 71 | -12.9 |
| 3.5 | 72 | -12.8 |

[FIG. 10C]
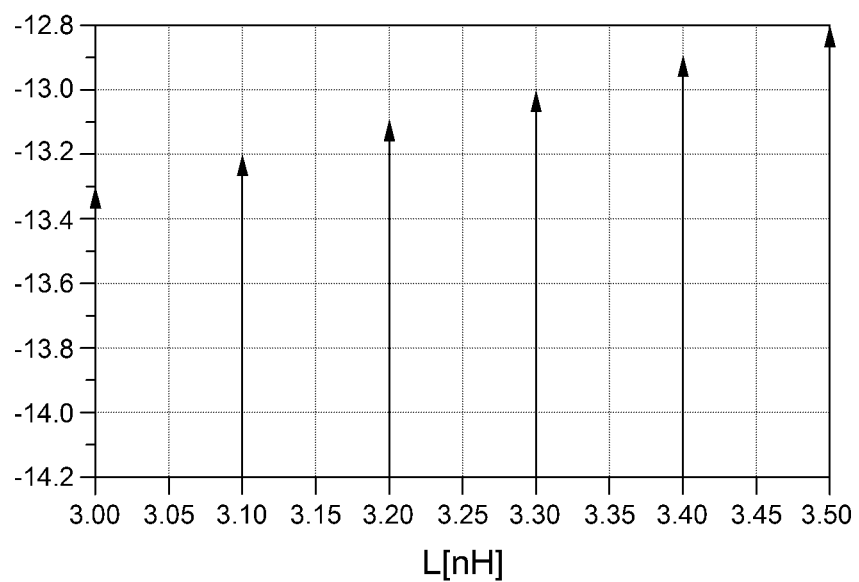

PRINTED CIRCUIT BOARD

CROSS-REFERENCE TO RELATED APPLICATIONS

This application claims the foreign priority benefit under 35 U.S.C. Section 119 of Korean Patent Application Serial No. 10-2013-0143867, entitled filed Nov. 25, 2013, which is hereby incorporated by reference in its entirety into this application.

BACKGROUND OF THE INVENTION

1. Field of the Invention

The present invention relates to a printed circuit board, and more particularly, to a printed circuit board that provides a variable inductance.

2. Description of the Related Art

Owing to the recent development in the integrated circuit (IC) process technology, it is possible to manufacture radio frequency ICs (RFIC) for a plurality of applications such as wireless communication, networking, and computing. In recent times, with the adoption of multi-band/multi-mode, various systems such as cellular communication, WiFi communication, and Bluetooth communication are implemented as one-chip.

This RFIC may include various analog circuit blocks which are previously implemented as large individual circuit components. The analog circuit blocks use reactance components such as a capacitor and an inductor to achieve designed functions. For example, a filter, a resonator tank, and an impedance matching network, etc. may include a capacitor and an inductor to obtain a desired circuit response.

In this circuit, in order to provide the possibility of some degree of tuning, it is known that variable capacitor and inductor, that is, a capacitor and an inductor in which a value can vary to a specific range are used. A very well-know example of this variable element is a so-called varicap diode that allows a specific change in capacitance value by applying a continuous variable voltage.

However, an example of the variable inductor is not almost known. Even in case of an of an inductor 1 shown in FIG. 1, the inductor, which increases an inductance value by connecting lines 10 of respective layers through a via 20, is used, but the above inductor 1 fixedly uses the required inductance value.

However, the variable inductor is very useful for the above circuit etc. For example, it is possible to provide a variable inductance to integrated circuits etc. capable of various applications in wireless communication systems, thus enabling tuning according to output characteristics of each IC. Further, when the output characteristics of the IC are changed because of reasons such as variations in manufacturing processes, if it can be tuned to an inductance value corresponding to the output characteristics of the IC, it is apparent that it is very efficient in securing mass-productivity etc.

However, inductors 2 shown in FIG. 2 are implemented in an IC, resulting in an increase in size of the IC. Accordingly, it becomes a burden in terms of miniaturization and cost.

Therefore, above all, it is needed to develop a variable inductor that can achieve miniaturization and cost reduction as well as tune output characteristics of each IC and respond sensitively to changes in characteristics according to manufacturing processes in integrated circuits etc. capable of various applications.

RELATED ART DOCUMENT

Patent Document

Patent Document 1: Korean Patent Laid-Open Publication No. 2011-0115122

SUMMARY OF THE INVENTION

The present invention has been invented in order to overcome the above-described problems and it is, therefore, an object of the present invention to provide a printed circuit board that can respond sensitively to changes in characteristics according to manufacturing processes as well as tune output characteristics of each IC in integrated circuits etc. capable of various applications in wireless communication systems.

It is another object of the present invention to provide a printed circuit board that can achieve miniaturization and cost reduction.

In accordance with one aspect of the present invention to achieve the object, there is there is provided a printed circuit board including: an inductor positioned between an input terminal and an output terminal; a switch connected to the inductor; and a controller connected to the output terminal and the switch and outputting a control signal for controlling the switch to the switch, wherein the inductor may be formed of a plurality of circuit patterns having different plating thicknesses and signal paths for the plurality of circuit patterns may be selectively connected by operation of the switch according to the control signal.

In an embodiment of the present invention, the printed circuit board may include a plurality of metal pads which are separated from each other by each insulating layer and have a plurality of multilayer circuit patterns formed by connecting the plurality of metal pads through vias.

In an embodiment of the present invention, the plurality of circuit patterns, which are formed as the inductor, may include a plurality of metal pads which are separated from each other by each insulating layer and be multilayer circuit patterns formed by connecting the plurality of metal pads through vias.

In an embodiment of the present invention, the plurality of circuit patterns may be formed in a dummy area.

In an embodiment of the present invention, the switch may be connected to the uppermost metal pad of the plurality of metal pads.

In an embodiment of the present invention, the switch may be a metal oxide silicon field effect transistor (MOSFET).

In an embodiment of the present invention, the switch may be a multiplexer (MUX).

In an embodiment of the present invention, the controller may set a proportional correlation between an output level of the output terminal and inductance values corresponding to the plurality of circuit patterns and output the control signal according to the set proportional correlation to the switch.

In an embodiment of the present invention, the controller may include a detector for detecting a voltage level of the output terminal; and a comparator for outputting the control signal according to the result of comparison to the switch by comparing the voltage level detected by the detector with a preset reference voltage.

In an embodiment of the present invention, the inductor may be included in at least one of a filter and an impedance matching network.

In an embodiment of the present invention, the inductor may be included in at least least one of an amplifier, a voltage-controlled oscillator (VCO), a phase-locked loop (PLL), and a mixer.

In another embodiment of the present invention, the plurality of metal pads may have different lengths.

In another embodiment of the present invention, the plurality of circuit patterns may be formed in a dummy area.

In another embodiment of the present invention, the switch may be connected to the uppermost metal pad of the plurality of metal pads.

In another embodiment of the present invention, the switch may be a MOSFET.

In another embodiment of the present invention, the switch may be a MUX.

In another embodiment of the present invention, the controller may set a proportional correlation between an output level of the output terminal and inductance values corresponding to the plurality of circuit patterns and output the control signal according to the set proportional correlation to the switch.

In another embodiment of the present invention, the controller may include a detector for detecting a voltage level of the output terminal; and a comparator for outputting the control signal according to the result of comparison to the switch by comparing the voltage level detected by the detector with a preset reference voltage.

In another embodiment of the present invention, the inductor may be included in at least one of a filter and an impedance matching network.

In another embodiment of the present invention, the inductor may be included in at least one of an amplifier, a VCO, a PLL, and a mixer.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which:

FIG. 1 is a view illustrating an inductor having a fixed inductance;

FIG. 2 is a view illustrating a typical inductor implemented in an IC;

FIG. 3 is a block diagram of a typical wireless communication system;

FIG. 4 is a view showing a schematic structure of a pattern formed on a printed circuit board;

FIG. 5 is a view showing inductance characteristics according to a plating thickness of a pattern;

FIG. 6 is a view showing inductance characteristics according to a length and a plating thickness of a pattern;

FIG. 7 is a cross-sectional view of a printed circuit board including an inductor in accordance with a first embodiment of the present invention;

FIG. 8 is a cross-sectional view of a printed circuit board including an inductor in accordance with a second embodiment of the present invention;

FIG. 9 is a view showing an embodiment of an amplifier including an inductor in accordance with the present embodiment; and FIGS. 10A, 10B, and 10C are views showing examples of different inductance values which can be obtained in accordance with the present embodiment and corresponding output characteristics of an amplifier.

DETAILED DESCRIPTION OF THE PREFERABLE EMBODIMENTS

A matter regarding to an operational effect including a technical configuration for an object of a printed circuit board in accordance with the present invention will be clearly appreciated through the following detailed description with reference to the accompanying drawings showing preferable embodiments of the present invention.

Further, in describing the present invention, descriptions of well-known techniques are omitted so as not to unnecessarily obscure the embodiments of the present invention. In the present specification, the terms "first," "second," and the like are used for distinguishing one element from another, and the elements are not limited to the above terms.

FIG. 3 is a block diagram of a typical wireless communication system 100.

In a transmission path, a digital signal processor (DSP) 110 processes data to be transmitted and provides a chip stream to a transceiver unit 120.

The transceiver unit 120 converts the chip stream into one or more analog signals through one or more digital-analog converters (not shown). At this time, the analog signal is filtered by a filter 121.

Further, the filtered signal is up-converted into a radio frequency (RF) in a baseband by a mixer 122 to generate an RF signal. At this time, the frequency up-conversion is performed by an up-conversion local oscillator signal from a voltage-controlled oscillator (VCO) 123.

The frequency up-converted signal is amplified by a power amplifier (PA) 125 after being amplified by a variable gain amplifier (VGA) 124, and routed through an RF front-end-module (FEM) 130 to be transmitted from an antenna 140.

Meanwhile, in a receiving path, a modulated signal is received by the antenna 140, routed through the RF FEM 130, and amplified by a low-noise amplifier (LNA) 126.

Further, the amplified signal is frequency down-converted from RF to baseband by a mixer 127 along with a down-conversion local oscillator signal from the VCO 123. The down-converted signal is filtered by a filter 129 after being amplified by a VGA 128, and digitized by one or more analog-digital converters (not shown) to obtain one or more sample streams. The sample stream is provided to the DSP 110 for processing.

At this time, a phase-locked loop (PLL) receives control information from the DSP 110 and provides control for the VCO 123 to generate appropriate up-conversion and down-conversion of the respective local oscillator signals.

Meanwhile, FIG. 3 shows an example of design of a transceiver of the typical wireless communication system 100. As known in the art, in the typical transceiver, conditioning of a transmitted signal and conditioning of a received signal may be performed by one or more stages such as an amplifier, a filter, and a mixer. Further, FIG. 3 shows only a portion of a circuit block that can be used only to condition the transmitted signal and the received signal.

Meanwhile, as shown in FIG. 3, the typical wireless communication system 100 may include a digital part and an analog part. At this time, the digital part (for example, DSP 110, digital-analog converter, analog-digital converter, etc.) may be implemented on one or more digital integrated circuits (IC). Further, the analog part (for example, filters 121 and 129, mixers 122 and 127, VCO 123, etc.) may be implemented on one or more RF integrated circuits (RFIC) or implemented as other individual components.

In addition, as shown in FIG. 3, the transceiver unit 120 includes various analog circuit blocks for various functions. The respective analog circuit blocks may be implemented as circuit elements such as a transistor, a resistor, an inductor, and a capacitor.

A variable inductance may be required for some analog circuit blocks such as the filters 121 and 129, the VCO 123, the power amplifier 125, and the LNA 126, and a variable inductor can provide this variable inductance.

Meanwhile, FIG. 4 is a view showing a schematic structure of a pattern formed on a printed circuit board. An inductance correlation according to the width W, length L, and height H of the above pattern can be checked through the following Equation 1.

$$\text{Inductance} = 0.0002L\left[\ln\frac{2L}{(W+H)} + 0.2235\left(\frac{W+H}{L}\right) + 0.5\right]\mu H \quad \text{[Equation 1]}$$

Referring to Equation 1, it can be understood that inductance characteristics are changed according to the plating thickness H of the pattern formed on the printed circuit board.

This content can be understood more clearly through FIG. 5. Here, FIG. 5 is a view showing the inductance characteristics according to the plating thickness of the pattern and shows the inductance characteristics according to the plating thickness of the pattern and changes in frequency, which are obtained through computer simulation.

As can be seen from Equation 1 and FIG. 5, it can be understood that the inductance characteristics are changed according to the plating thickness of the pattern.

For example, referring to FIG. 5, in case that the width, length, and frequency of the pattern are 10 μm, 800 μm, and 2 GHz, respectively, when the plating thickness is 1 μm, the inductance is 0.54 nH (m10), but on the other hand, when the plating thickness is 22 μm, the inductance is 0.32 nH (m11). Through these simulation results, it can be clearly understood that the inductance characteristics are changed according to the plating thickness of the pattern.

Therefore, if a plurality of patterns having different plating thicknesses can be formed on the printed circuit board, a variable inductance can be provided through the above inductance characteristics.

Meanwhile, referring to the above-described Equation 1, it can be understood that the that the inductance characteristics are changed according to the length L of the pattern formed on the printed circuit board.

This content can be understood more clearly through FIG. 6. Here, FIG. 6 is a view showing the inductance characteristics according to the length and plating thickness of the circuit pattern and shows the inductance characteristics according to the changes in the plating thickness of the pattern, which are obtained through computer simulation, for example, when the length of the pattern is 800 μm (A) and 1600 μm (B).

As can be seen from Equation 1 and FIG. 6, it can be clearly understood that the inductance value is increased according to the increase in the length of the pattern even though the plating thickness is the same.

For example, referring to FIG. 6, when the length of the pattern is 800 μm (A), the inductance value varies from 0.54 nH to 0.32 nH according to the plating thickness, but on the other hand, when the length of the pattern is 1600 μm (B), the inductance value varies from 1.1 nH to 0.65 nH.

That is, when the length of the pattern is 1600 μm (B), it is possible to obtain a higher inductance value than when the length of the circuit pattern is 800 μm (A) even though the plating thickness is the same.

Therefore, if a plurality of patterns having different lengths as well as different plating thicknesses can be formed on the printed circuit board, an inductance can vary more precisely.

Thus, hereinafter, a printed circuit board, which can provide a variable inductance by including a plurality of circuit patterns having different plating thicknesses, will be described in detail based on the following embodiment.

FIG. 7 is a cross-sectional view of a printed circuit board 200 including an inductor 220 in accordance with a first embodiment of the present invention.

The printed circuit board 200 according to the present embodiment, as shown in FIG. 7, may mount thereon an integrated circuit (IC) 210 etc. applied to a wireless communication system and include the inductor 220.

The inductor 220, as shown in FIG. 7, may be formed in the printed circuit board 200 200 as a plurality of circuit patterns 221, 222, 223, and 224 having different plating thicknesses. At this time, the shape of the circuit patterns 221, 222, 223, and 224 shown in FIG. 7 is merely an example, and various applications such as circular or polygonal vortex-shaped circuit patterns are possible.

The printed circuit board 200 according to the present embodiment mounts thereon the IC etc. applied to the wireless communication system etc. as shown in FIG. 3, but the present invention is not limited thereto and can use any element if it is an active element that can be electrically connected to the printed circuit board 200.

Further, the printed circuit board 200 according to the present embodiment, as shown in FIG. 7, may be formed in a multilayer structure. Accordingly, the printed circuit board 200 according to the present embodiment can include a plurality of metal pads a, b, c, and d, which are separated from each other by insulating layers 231, 232, 233, and 234, and a plurality of multilayer circuit patterns 221 to 226, which are formed by connecting the plurality of metal pads a, b, c, and d through vias e, f, g, and h. However, the present invention is not limited thereto and can use any form if it can form a plurality of circuit patterns having different plating thicknesses.

Meanwhile, when the inductor 220 is applied to the above multilayer printed circuit board 200, the plurality of circuit patterns 221, 222, 223, and 224, which are formed as the inductor 220, as shown in FIG. 7, may be included in the plurality of multilayer circuit patterns 221 to 226 formed on the printed circuit board 200.

Therefore, the plurality of circuit patterns 221, 222, 223, and 224 also may include the plurality of metal pads a, b, c, and d, which are separated from each other by the respective insulating layers 231, 232, 233, and 234, and be the multilayer circuit patterns 221, 222, 223, and 234, which are formed by connecting the plurality of metal pads a, b, c, and d through the vias e, f, g, and h.

In this case, the circuit patterns 221, 222, 223, and 224 of the present embodiment, as shown in FIG. 7, may be formed on the printed circuit board 200 so that the metal pads a, b, c, and d have different plating thicknesses. Thus, the plurality of circuit patterns 221, 222, 223, and 224 having the different plating thicknesses can be formed on the printed circuit board 200.

At this time, the plurality of metal pads a, b, c, and d and vias e, f, g, and h, which constitute the plurality of circuit patterns 221, 222, 223, and 224, respectively, may function as a signal path for each of the plurality of circuit patterns 221, 222, 223, and 224.

Since the circuit patterns 221, 222, 223, and 224 of the present embodiment configured as above have the different plating thicknesses, as already described in Equation 1 and FIGS. 4 and 5, the circuit patterns 221, 222, 223, and 224 have different inductance values. Accordingly, it is possible to provide a variable inductance by selectively changing control signal paths for the plurality of circuit patterns 221, 222, 223, and 224 through a switch etc.

Meanwhile, the plurality of circuit patterns 221, 222, 223, and 224, which are formed as the inductor 220, as shown in FIG. 7, are preferred to be formed in a dummy area of the printed circuit board 200. This is because it is not needed to allocate a separate area for forming the inductor by using the dummy area which corresponds to the remaining unused area, not the area that is already used as a signal path to the mounted IC etc.

Meanwhile, FIG. 8 is a cross-sectional view of a printed circuit board 300 including an inductor 320 in accordance with a second embodiment of the present invention.

The printed circuit board 300 according to the present embodiment, as shown in FIG. 8, may mount thereon an IC 310 etc. applied to a wireless communication system and include the inductor 320.

The IC 310 etc. mounted on the printed circuit board 300 according to the present embodiment have the same configurations as those of the first embodiment. Thus, descriptions thereof will be omitted. Therefore, hereinafter, elements (inductor 320 etc.) that are different from those of the printed circuit board 200 of the first embodiment will be mainly described.

The inductor 320 of the present embodiment may be formed on the printed circuit board 300 as a plurality of circuit patterns 321, 322, 323, and 324 having different plating thicknesses. At this time, the shape of the circuit patterns 321, 322, 323, and 324 shown in FIG. 8 is merely an example, and various applications such as circular or polygonal vortex-shaped circuit patterns are possible like the first embodiment.

Meanwhile, the printed circuit board 300 according to the present embodiment, like like the first embodiment, may be formed in a multilayer structure. Accordingly, the printed circuit board 300 according to the present embodiment can include a plurality of metal pads a, b, c, and d, which are separated from each other by insulating layers 331, 332, 333, and 334, and a plurality of multilayer circuit patterns 321 to 326, which are formed by connecting the plurality of metal pads a, b, c, and d through vias e, f, g, and h. However, as in the first embodiment, the present invention is not limited thereto and can use any form if it can form a plurality of circuit patterns having different plating thicknesses.

Meanwhile, when the inductor 320 is applied to the above multilayer printed circuit board 300, the plurality of circuit patterns 321, 322, 323, and 324, which are formed as the inductor 320 may be included in the plurality of multilayer circuit patterns 321 to 326 formed on the printed circuit board 300 as in the first embodiment.

Therefore, as in the first embodiment, the plurality of circuit patterns 321, 322, 323, and 324 also may include the plurality of metal pads a, b, c, and d, which are separated from each other by the respective insulating layers 331, 332, 333, and 334, and be the multilayer circuit patterns 321, 322, 323, and 324, which are formed by connecting the plurality of metal pads a, b, c, and d through the vias e, f, g, and h.

In this case, the circuit patterns 321, 322, 323, and 324 of the present embodiment, like the first embodiment, may be formed on the printed circuit board 300 so that the metal pads a, b, c, and d have different plating thicknesses. Thus, the plurality of circuit patterns 321, 322, 323, and 324 having the different plating thicknesses can be formed on the printed circuit board 300.

At this time, the plurality of metal pads a, b, c, and d and vias e, f, g, and h, which constitute the plurality of circuit patterns 321, 322, 323, and 324, respectively, have the same function as those of the first embodiment. Thus, descriptions thereof will be omitted.

Since the circuit patterns 321, 322, 323, and 324 of the present embodiment configured as above have the different plating thicknesses as in the first embodiment, as already described in Equations 1 and FIGS. 4 and 5, the circuit patterns 321, 322, 323, and 324 have different inductance values. Accordingly, it is possible to provide a variable inductance by selectively changing control signal paths for the plurality of circuit patterns 321, 322, 323, and 324 through a switch etc.

However, the circuit patterns 321, 322, 323, and 324 of the present embodiment, as shown in FIG. 8, are different from the circuit patterns 221, 222, 223, and 224 of the first embodiment in that they can be implemented as the plurality of patterns 321, 322, 323, and 324 having different lengths as well as different plating thicknesses.

That is, the circuit patterns 321, 322, 323, and 324 of the present embodiment, as as shown in FIG. 8, may be formed on the printed circuit board 300 so that the metal pads a, b, c, and d have different lengths as well as different plating thicknesses. Thus, the plurality of patterns 321, 322, 323, and 324 having the different lengths as well as the different plating thicknesses can be formed on the printed circuit board 300.

Therefore, in the present embodiment, as already described in FIG. 6, an inductance can vary more precisely than the first embodiment.

Meanwhile, the circuit patterns 321, 322, 323, and 324 of the present embodiment, which are formed as the inductor 320, as shown in FIG. 8, are preferred to be formed in a dummy area of the printed circuit board 300. A specific reason thereof is the same as in the first embodiment. Thus, a description thereof will be omitted.

The inductors 220 and 320 formed in the printed circuit boards 200 and 300 of the present embodiment as above may be used in arbitrary circuit blocks in which inductance adjustment is useful. For example, the above inductors 220 and 320 may be used in a filter, an impedance matching network, etc.

Further, as shown in FIG. 3, this circuit block may be a portion of a larger circuit block such as an amplifier, a VCO, a PLL, or a mixer.

Hereinafter, an exemplary amplifier including an inductor of the present embodiment will be described.

FIG. 9 shows an embodiment of an amplifier 400 including an inductor according to the present embodiment.

The amplifier 400 according to the present embodiment, as shown in FIG. 9, may include an inductor 410, a switch 420, and a controller 430.

The inductor 410, as shown in FIG. 9, may be positioned between an input terminal IN and an output terminal OUT of the amplifier 400.

At this time, the inductor 410 is an inductor according to the above-described first or second embodiment and may be implemented as a plurality of circuit patterns having different plating thicknesses or a plurality of patterns having different lengths as well as different plating thicknesses.

The switch 420, as shown in FIG. 9, may be connected to the inductor 410 formed as a plurality of circuit patterns according to the first or second embodiment and selectively provide inductance values corresponding to the respective circuit patterns by selectively connecting signal paths for the above circuit patterns.

In this case, the switch 420 may be connected to the respective circuit patterns having patterns having different inductance values. When the inductor is applied to a multilayer printed thereto and can use any switching element if it can selectively connect the respective circuit patterns having the different inductance values through opening and closing operations.

Further, the switch 420 may be implemented in a digital manner. In this case, the switch 420 may be implemented using a MUX etc. implemented in a digital signal processor or other digital ICs in the wireless communication system as shown in FIG. 3. However, the present invention is not limited thereto and can use any element if it can selectively connect the signal paths for the respective circuit patterns having the different inductance values in a digital manner.

The controller 430 may be connected to the output terminal OUT and the switch 420, generate a control signal for controlling opening and closing of the switch 420 according to output of the output terminal OUT, and output the control signal to the switch 420.

At this time, the controller 430, as shown in FIG. 9, may include a detector 431 and a comparator 432.

In this case, the detector 431 may perform a function of detecting a voltage level of the output terminal OUT, and the comparator 432 may compare a size relationship between the voltage level $OUT\_V_{det}$ detected by the detector 431 and a preset reference voltage and output the control signal according to the result of the comparison to the switch 420. At this time, the reference voltage may be set to a voltage level corresponding to output characteristics of the amplifier 400.

An example of a control principle of the above controller 430 will be described below in detail based on FIGS. 9, 10A, 10B, and 10C.

FIGS. 10A, 10B, and 10C show examples of the different inductance values, which can be obtained according to the present embodiment, and the corresponding output characteristics of the amplifier, wherein FIG. 10A shows a schematic structural diagram of the amplifier having the normal output characteristics, and FIGS. 10B and 10C show the output characteristics of the amplifier of FIG. 10A according to the inductance values.

As shown in FIGS. 10A-10C, if it is a normal state without special conditions such as variations in manufacturing processes, it can be seen that the output characteristics corresponding with the amplifier are satisfied only when output levels OUT_V[mV1] and OUT_PWR[dBm] shown in FIGS. 10B and 10C are output for a specific inductance value.

Therefore, as can be seen from FIGS. 10B and 10C, it is possible to obtain such as variations in manufacturing processes, it can be seen that the output characteristics corresponding with the amplifier are satisfied only when output levels OUT_V[mV1] and OUT_PWR[dBm] shown in FIGS. 10B and 10C are output for a specific inductance value.

Therefore, as can be seen from FIGS. 10B and 10C, it is possible to obtain information about a proportional correlation between the output level OUT_V[mV1] and OUT_PWR[dBm] of the output terminal OUT and the inductance value L[nH] from resulting values (for example, contents shown in FIGS. 10B and 10C) obtained through many tests.

Accordingly, through the many test resulting values shown as above, the controller 430 of the present embodiment can set the information about the proportional correlation between the output level of the output terminal OUT of the amplifier and the inductance values (that is, the respective inductance values corresponding to the plurality of circuit patterns of the first or second embodiment), which can be obtained according to the present embodiment, to a digital signal processor etc. and output a control signal according to the set proportional correlation to the switch 420 to control operation of the switch 420 for changing the inductance.

For example, suppose that the amplifier 400 of FIG. 9 connected to the circuit pattern having an inductance value of 3.3 nH actually outputs a level higher than 70 mV (refer to FIG. 10B), which is a normal output, due to variations in manufacturing processes etc.

In this case, through the many test resulting values shown in FIGS. 10B and 10C, it is possible to deduce a proportional correlation that the inductance value L[nH] is decreased according to the decrease in the output level OUT_V[mV] of the output terminal OUT. Accordingly, the controller 430 can set the proportional correlation deduced as above in the form of table values etc.

After that, the controller 430 can output the control signal (for example, a high-level comparative output voltage output from the comparator 432) for connecting the switch 420 to the circuit pattern corresponding to the inductance value for decreasing the actual output level of the amplifier 400 to 70 mV which is a normal output, that is, the inductance value less than the current inductance value 3.3 nH to the switch 420 using the set proportional correlation (that is, the proportional correlation that the inductance value is decreased according to the decrease in the output level of the output terminal).

Therefore, the present embodiment can change the inductance value to the the inductance value corresponding with the output characteristics of the amplifier 400 through the above control process.

Meanwhile, since the printed circuit board according to the present embodiment, which is described above, can provide a variable inductance as above, the printed circuit board according to the present embodiment may be used for inductance matching of various types of ICs such as RFIC, application specific integrated circuits (ASIC), and digital signal processors (DSP).

Further, ICs, which receive a variable inductance through the printed circuit board of the present embodiment, may be used in various systems and applications such as communication, networking, and computing.

For example, these ICs may be used in wireless communication systems such as a code division multiple access (CDMA) system, a wideband CDMA (W-CDMA) system, a time division multiple access (TDMA) system, a global system for mobile communications (GSM) system, an advanced mobile phone system (AMPS) system, a global positioning system (GPS), a multiple-input multiple-out (MIMO) system, an orthogonal frequency division multiplexing (OFDM) system, an orthogonal frequency division multiple access (OFDMA) system, and a wireless local area network (WLAN) system.

As described above, the printed circuit board configured as above has an advantage of tuning output characteristics of each IC in integrated circuits etc. capable of various applications in wireless communication systems by forming a plurality of circuit patterns having different plating thicknesses and thus providing a variable inductance.

Further, the printed circuit board configured as above has an advantage of sensitively responding to changes in characteristics according to manufacturing processes such as variations in the manufacturing processes by forming a plurality of circuit patterns having different plating thicknesses and thus providing a variable inductance.

Further, the printed circuit board configured as above is advantageous in terms of miniaturization and cost by implementing a circuit pattern having variable inductance characteristics on a printed circuit board.

In addition, the printed circuit board configured as above has no need to allocate a separate area for forming an inductor by forming a circuit pattern having variable inductance characteristics in a dummy area.

The functions of the various elements shown in the drawings may be provided through provided through the use of dedicated hardware as well as hardware capable of executing software in association with appropriate software. When provided by a processor, the functions may be provided by a single dedicated processor, by a single shared processor, or by a plurality of individual processors, some of which may be shared.

Moreover, explicit use of the term "controller" should not be construed to refer exclusively to hardware capable of executing software, and may implicitly include, without limitation, microprocessor (MCU), digital signal processor (DSP) hardware, read-only memory (ROM) for storing software, random access memory (RAM), and non-volatile storage.

In the claims hereof, any element expressed as a means for performing a specified function is intended to encompass any way of performing that function including, for example, a combination of circuit elements which performs that function or software in any form, including, therefore, firmware, microcode or the like, combined with appropriate circuitry for executing that software to perform the function.

Reference in the specification to "an embodiment" of the present principles, as well as other variations thereof, means that a particular feature, structure, characteristic, and so forth described in connection with the embodiment is included in at least one embodiment of the present principles. Thus, the appearances of the phrase "in an embodiment", as well as any other variations, appearing in various places throughout the specification are not necessarily all referring to the same embodiment.

Reference in the specification to "connect" or "connecting", as well as other variations thereof, means that an element is directly connected to the other element or indirectly connected to the other element through another element. Throughout this specification, the singular form includes the plural form unless the context clearly indicates otherwise. When terms "comprises" and/or "comprising" used herein do not preclude existence and addition of another component, step, operation and/or device, in addition to the above-mentioned component, step, operation and/or device.

In the specification, "at least one of" in the case of "at least one of A and B" is intended B" is intended to encompass the selection of the first listed option (A) only, or the selection of the second listed option (B) only, or the selection of both options (A and B). As a further example, the case of "at least one of A, B, and C" is intended to encompass the selection of the first listed option (A) only, or the selection of the second listed option (B) only, or the selection of the third listed option (C) only, or the selection of the first and second listed options (A and B) only, or the selection of the second and third listed options (B and C) only, or the selection of all three options (A, B, and C). This can be extended, as readily apparent by those skilled in the related arts, for as many items listed.

So far the preferable embodiments of the present invention have been described. All the embodiments and conditional examples disclosed through the specification are intended to help those skilled in the art to understand the principles and concepts of the present invention, and it will be appreciated by those skilled in the art that the present invention can be implemented in a modified form without departing from the essential characteristics of the present invention. Therefore, the embodiments should be considered in descriptive sense and not for purpose of limitation. The scope of the present invention is defined by the appended claims rather than the foregoing description, and all differences within the scope will be construed as being included in the present invention.

What is claimed is:

1. A printed circuit board comprising:
   an inductor positioned between an input terminal and an output terminal;
   a switch connected to the inductor; and
   a controller connected to the output terminal and the switch and configured to output a control signal to the switch, the control signal configured for controlling the switch according to an output of the output terminal,
   wherein the inductor comprises a plurality of circuit patterns that are physically separated from one another,
   wherein the plurality of circuit patterns each have a different plating thickness such that the plurality of circuit patterns each have a different inductance value,
   wherein the switch is configured to selectively open and close connections for the plurality of circuit patterns according to the control signal to allow an inductance value of the inductor to be changed,
   wherein the plurality of circuit patterns each comprise a plurality of metal pads and a plurality of vias connecting the plurality of metal pads,
   wherein the plurality of metal pads belonging to a same circuit pattern are arranged in a thickness direction of the printed circuit board,
   wherein the plurality of metal pads belonging to the circuit patterns different from one another are arranged in a lengthwise direction of the printed circuit board,
   wherein the plurality of vias belonging to a same circuit pattern are arranged in a thickness direction of the printed circuit board, and
   wherein the plurality of vias belonging to the circuit patterns different from one another are arranged in a lengthwise direction of the printed circuit board.

2. The printed circuit board according to claim 1, wherein the plurality of circuit patterns are formed in a dummy area.

3. The printed circuit board according to claim 1, wherein the switch is connected to an uppermost metal pad of the plurality of metal pads.

4. The printed circuit board according to claim 1, wherein the switch comprises a metal oxide silicon field effect transistor.

5. The printed circuit board according to claim 1, wherein the switch comprises a multiplexer.

6. The printed circuit board according to claim 1, wherein the controller sets a proportional correlation between an output level of the output terminal and inductance values corresponding to the plurality of circuit patterns and outputs the control signal to the switch according to the set proportional correlation.

7. The printed circuit board according to claim 6, wherein the controller comprises:
   a detector configured to detect a voltage level of the output terminal; and
   a comparator configured to compare the voltage level detected by the detector with a reference voltage and to output the control signal to the switch according to a result of the comparison.

8. The printed circuit board according to claim 1, wherein the inductor is included in one or both of a filter and an impedance matching network.

9. The printed circuit board according to claim 1, wherein the inductor is included in any one or any combination of any two or more of an amplifier, a voltage-controlled oscillator, a phase-locked loop, and a mixer.

* * * * *